United States Patent
Xiu (10) Patent No.: US 10,715,154 B2
(45) Date of Patent: Jul. 14, 2020

(54) DIGITALLY CONTROLLED OSCILLATOR AND ALL-DIGITAL FREQUENCY-LOCKED LOOP AND PHASE-LOCKED LOOP BASED ON DIGITALLY CONTROLLED OSCILLATOR

(71) Applicant: BOE TECHNOLOGY GROUP CO., LTD., Beijing (CN)

(72) Inventor: Liming Xiu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 17 days.

(21) Appl. No.: 15/761,708

(22) PCT Filed: Aug. 31, 2017

(86) PCT No.: PCT/CN2017/099965
§ 371 (c)(1),
(2) Date: Mar. 20, 2018

(87) PCT Pub. No.: WO2018/126720
PCT Pub. Date: Jul. 12, 2018

(65) Prior Publication Data
US 2019/0123749 A1    Apr. 25, 2019

(30) Foreign Application Priority Data
Jan. 4, 2017  (CN) .......................... 2017 1 0004456

(51) Int. Cl.
*H03L 7/06* (2006.01)
*H03L 7/099* (2006.01)
(Continued)

(52) U.S. Cl.
CPC ............ *H03L 7/0992* (2013.01); *H03L 7/087* (2013.01); *H03L 7/093* (2013.01); *H03L 7/099* (2013.01); *H03L 7/18* (2013.01); *H03L 2207/50* (2013.01)

(58) Field of Classification Search
CPC ........... H03B 21/02; H03B 21/00; H03L 7/16; H03L 7/18; H03L 7/23; H03L 7/0891; H03L 7/093; H03L 7/087; H03L 7/10
(Continued)

(56) References Cited

U.S. PATENT DOCUMENTS 7,065,172 B2    6/2006  Xiu et al.
8,664,988 B1*   3/2014  Xiu ........................ H03L 7/081
                                                    327/147
(Continued)

OTHER PUBLICATIONS

Xiu, Liming, "From Frequency to Time Average Frequency a Paradigm Shift in the Design of Electronic Systems" IEEE Press Series on Microelectronic Systems, IEEE Press, 2015, pp. 1-179.
(Continued)

Primary Examiner — Anh Q Tra
(74) Attorney, Agent, or Firm — Dilworth & Barrese, LLP.; Michael J. Musella, Esq.

(57) ABSTRACT

A digitally controlled oscillator, including: a frequency divider chain, configured to perform frequency division on an input clock signal to produce K basic clock signals, wherein frequencies and periods of the K basic dock signals are the same and a time difference between two adjacent basic clock signals is a basic time unit; and a frequency synthesizer, configured to receive the K basic clock signals from the frequency divider chain, determine a first period and a second period according to the basic time unit and a frequency control word, and generate a synthetic clock signal based on the K basic clock signals, wherein the synthetic clock signal uses the first period and the second period in an alternate manner.

8 Claims, 4 Drawing Sheets

(51) Int. Cl.
*H03L 7/093* (2006.01)
*H03L 7/087* (2006.01)
*H03L 7/18* (2006.01)

(58) Field of Classification Search
USPC .......................................... 327/105, 147, 156
See application file for complete search history.

(56) References Cited

U.S. PATENT DOCUMENTS

| | | |
|---|---|---|
| 9,379,714 B1 | 6/2016 | Xiu |
| 2007/0055718 A1* | 3/2007 | Xu ........................ G06F 1/025 708/270 |
| 2009/0161809 A1 | 6/2009 | Xiu et al. |
| 2014/0197867 A1* | 7/2014 | Xiu ........................ G06F 1/08 327/105 |
| 2016/0028350 A1* | 1/2016 | Turner .................. H03K 5/131 327/107 |

OTHER PUBLICATIONS

Xiu, Liming, "Book-Nanometer-Frequency-Synthesis Beyond the Phase-Locked Loop" Journal, pp. 1-334, IEEE Press, 2012.
International Search Report dated Nov. 7, 2017.

\* cited by examiner

DIGITALLY CONTROLLED OSCILLATOR AND ALL-DIGITAL FREQUENCY-LOCKED LOOP AND PHASE-LOCKED LOOP BASED ON DIGITALLY CONTROLLED OSCILLATOR

The present application claims the priority of the Chinese patent application No. 201710004456.9 filed on Jan. 4, 2017, titled "digitally controlled oscillator and all-digital frequency-locked loop and phase-locked loop based on digitally controlled oscillator. Herein, the content disclosed by the Chinese patent application is incorporated in full by reference as a part of the present application.

TECHNICAL FIELD

The present disclosure relates to a very large scale VLSI integrated circuit design, in particular, to a time average frequency direct period synthesis (TAF-DPS) digitally controlled oscillator and an all-digital frequency-locked loop and phase-locked loop based on the TAF-DPS digitally controlled oscillator

BACKGROUND

In the field of frequency synthesis, there are three major technologies: analog direct frequency synthesis, digital direct synthesis (DDS) and indirect frequency synthesis based on phase-locked loop (PLL). For on-chip clock generation, PLL has been the designers' first choice due to its easy integration with other circuitries on chip. However, in most PLL designs, the implementation is in an analogy-digital mixed-signal style. In other words, large amount of analog circuits are required. This is mainly due to the oscillator (VCO) used in the design, which is an analog component.

In recent years, an all-digital phase-locked loop (ADPLL) becomes a popular member in phase-locked loop PLL family. The noticeable feature of ADPLL is a digital oscillator contained inside the ADPLL, which is capable of controlling by a digital value a frequency of a clock signal produced by the digital oscillator. Compared with a conventional phase-locked loop, the all-digital phase-locked loop (ADPLL) reduces analog design complexity, which makes it suitable for being implemented on digital processes. However, the "digital oscillator" in such ADPLL is not a digital circuit. It still comprises large amount of analog circuitries. It is termed digital oscillator simply for the reason that its frequency tuning is achieved through digital control.

Therefore, an all-digital phase-locked loop and an all-digital frequency-locked loop are required.

SUMMARY

Other aspects and advantages of the present disclosure will be described in the following description. Some aspects can be evidently seen from the description, or can be obtained from the practice of the present disclosure.

In the present disclosure, a time-average-frequency direct period synthesis (TAF-DPS) is used for an all-digital frequency oscillator. Consequently, the all-digital frequency-locked loop and phase-locked loop are constructed using an oscillator such as a digitally controlled oscillator (DCO).

The key problem to be solved in the present disclosure is that using all-digital circuit to construct a frequency-locked loop (FLL) and a phase-locked loop (PLL). In other words, FLL and PLL are designed using the standard cells from any given ASIC library. Therefore, no analog circuitry is required in the FLL and PLL. Further, the design methodology is Verilog coding→simulation→synthesis→real circuit. The designing skills for custom circuit with transistor level are not needed.

In this disclosure, a TAF-DPS synthesizer is constructed entirely from digital standard cells from an ASIC library. A frequency-locked loop (FLL) is then built from this all-digital TAF-DPS DCO. The frequency detector used in this loop is a digital detector. Therefore, the entire loop is constructed in digital fashion wherein the response time of the loop is fully calculable in term of DCO cycles. The design target is to make the loop latency as small as possible so that the FLL's input frequency can be tracked (followed) as quickly as possible. The TAF-DPS also has capability of phase synthesis, which enables the possibility for a PLL to be built from this DCO.

The design will have higher operation reliability since digital circuit is more robust against environmental disturbances.

There is provided in the present disclosure a digitally controlled oscillator, comprising: a frequency divider chain, configured to perform frequency division on an input clock signal to produce K basic clock signals, wherein frequencies and periods of the K basic clock signals are the same, and a time difference between two adjacent basic clock signals is a basic time unit; and a time average frequency direct period synthesis TAF-DPS frequency synthesizer, configured to receive the K basic clock signals from the frequency divider chain, determine a first period and a second period according to the basic time unit and a frequency control word, and generate a synthetic clock signal based on the K basic clock signals, wherein the synthetic clock signal uses the first period and the second period in an alternate manner.

In one embodiment, a frequency and a period of the synthetic clock signal is calculated by the following formula: $1/f=T=F*\Delta$, where F is the frequency control word, $\Delta$ is the basic time unit, f is the frequency of the synthetic clock signal, and T is the period of the synthetic clock signal.

In an embodiment, the frequency control word equates to $I+r$, where I is an integer, $0 \leq r < 1$, where the first period equates to $I*\Delta$, the second period equates to $(I+1)*\Delta$, r is possibility of occurrence of the second period, and the period of the synthetic clock signal equates to $(1-r)*$the first period$+r*$the second period.

In an embodiment, a value of the basic time unit $\Delta=T_{div}/K=1/(K \cdot f_{div})$, $f_{div}=f_i/K$, wherein $T_{div}$ is the period of the K basic clock signals, $f_{div}$ is the frequency of the K basic clock signals, and $f_i$ is a frequency of the input clock signal of the frequency divider chain.

In an embodiment, the frequency synthesizer is a TAF-DPS frequency synthesizer.

There is further provided in the present disclosure an all-digital frequency-locked loop, comprising: the digitally controlled oscillator described above; a frequency divider, configured to perform frequency division on the synthetic clock signal output by the digitally controlled oscillator, to obtain a feedback clock signal, wherein a frequency dividing ratio is N, and N is an integer greater than or equal to 1; and a digital frequency detector, configured to detect a feedback clock frequency of the feedback clock signal, compare an input reference frequency with the feedback clock frequency, and update the frequency control word according to a frequency difference.

In an embodiment, the all-digital frequency-locked loop further comprises: a low-pass filter, configured to filter high frequency components and noises in an output signal of the digital frequency detector, and output a filtered signal as an updated frequency control word to the digitally controlled oscillator.

In an embodiment, all devices in the all-digital frequency-locked loop are digital devices.

There is further provided in the present disclosure an all-digital phase-locked loop, comprising: the digitally controlled oscillator described above; a frequency divider, configured to perform frequency division on the synthetic clock signal output by the digitally controlled oscillator, to obtain a feedback clock signal, wherein a frequency dividing ratio is N, and N is an integer greater than or equal to 1; a digital frequency detector, configured to detect a feedback clock frequency of the feedback clock signal, compare an input reference frequency with the feedback clock frequency, and update the frequency control word according to a frequency difference; and a digital phase detector, configured to detect a feedback clock phase of the feedback clock signal, compare an input reference phase with the feedback clock phase, and generate a phase control word according to a phase difference, wherein the digitally controlled oscillator further receives the phase control word, and adds the updated frequency control word and the phase control word to be an updated frequency control word.

In an embodiment, the all-digital phase-locked loop further comprises: a first low-pass filter, configured to filter high frequency components and noises in an output signal of the digital frequency detector, and output a filtered signal as an updated frequency control word to the digitally controlled oscillator.

In an embodiment, the all-digital phase-locked loop further comprises: a second low-pass filter, configured to filter high frequency components and noises in an output signal of the digital phase detector, and output a filtered signal as a phase control word to the digitally controlled oscillator.

In an embodiment, all devices in the all-digital phase-locked loop are digital devices.

BRIEF DESCRIPTION OF THE DRAWINGS

Preferable embodiments of the present disclosure will be described in detail by combining with figures, and the above and other purposes, characteristics and advantages of the present disclosure would become clearer, wherein same reference marks designate units having the same structure, and wherein.

DETAILED DESCRIPTION

The present disclosure will be described sufficiently by referring to the accompany figures showing embodiments of the present disclosure. However, the present disclosure can be implemented in various different forms, but shall not be deemed as being limited to the embodiments described herein. On the contrary, these embodiments are provided to make the present disclosure thorough and complete, and fully express the scope of the present disclosure to those skilled in the art. In the figures, components are amplified for the purpose of clarity.

Frequency synthesis architecture of time-average-frequency direct period synthesis (TAF-DPS) is based on the novel time average frequency concept. The distinguished features of TAF-DPS include small frequency granularity (also termed as arbitrary frequency generation) and fast frequency switching (also termed as instantaneous frequency switching). More importantly, its frequency switching speed is quantifiable. In other words, the response time from the moment of receiving the frequency control word updated to the moment of frequency switching is calculable in term of clock cycles. These features make TAF-DPS become an ideal circuit block for functioning as digital controlled oscillator (DCO).

Figure 1:
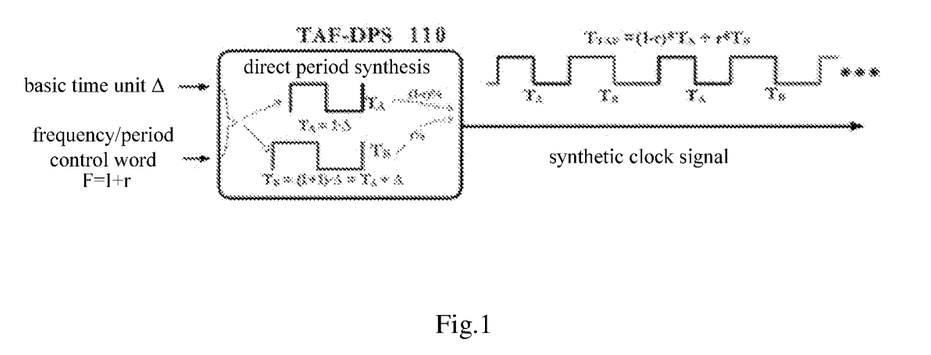
FIG. 1 schematically shows the operational principle of a time average frequency direct period synthesis (TAF-DPS) clock generator.

FIG. 1 schematically shows the operational principle of time average frequency direct period synthesis (TAF-DPS) clock generator.

As shown in FIG. 1, the TAF-DPS clock generator comprises a TAF-DPS frequency synthesizer 110 configured to determine a first period and a second period according to a basic time unit and a frequency control word, and generate a synthetic clock signal based on K basic clock signals, wherein the synthetic clock signal uses the first period and the second period in an alternate manner.

As shown in FIG. 1, the TAF-DPS frequency synthesizer 110 has first and second input parameters, the first input parameter is a basic time unit $\Delta$, and the second input parameter is a frequency control word $F=I+r$, where I is an integer, r is a fractional number, and $0 \leq r < 1$. An output terminal of the TAF-DPS frequency synthesizer 110 is configured to output a synthetic clock signal. The synthetic clock signal is a synthesized time average frequency clock signal. Generally, the frequency control word F is determined according to a target clock frequency input by a user, and the basic time unit $\Delta$ is designed according to the requirement for circuit design.

In particular, the TAF-DPS frequency synthesizer 110 determines the first period and the second period having different time lengths according to the basic time unit $\Delta$ and the frequency control word F. For example, the first period $T_A = I * \Delta$ and the second period $T_B = (I+1) * \Delta$. However, this patent is not limited thereto, and the first period and the second period can be determined in other manners.

Then, the TAF-DPS frequency synthesizer 110 determines a synthesis period using the first period $T_A$ and the second period $T_B$, and generates a synthetic clock signal by taking the synthesis period as the clock period, and then outputs the synthetic clock signal through its output terminal. For example, the synthesis period $T_{TAF}$ can be calculated by means of weighting based on the first period $T_A$ and the second period $T_B$. A weight of the first period $T_A$ is a first weight $W_A$, and a weight of the second period $T_B$ is a second weight $W_B$, then $T_{TAF} = W_A * T_A + W_B * T_B$. For example, possibility of occurrence of the first period $T_A$ and the second period $T_B$ can be controlled by the fractional number r. In other words, the first weight $W_A$ and the second weight $W_B$ can be decided by the value of the fractional number r, the first weight $W_A$ can be $(1-r)$, and the second weight $W_B$ can be r. In this condition, $T_{TAF} = (1-r) * T_A + r * T_B$. When F is an integer (i.e., r is zero), the first weight $W_A$ is 1, the second weight $W_B$ is 0, and the synthesis period $T_{TAF} = T_A$.

After the synthesis period $T_{TAF}$ is determined, the TAF-DPS frequency synthesizer 110 can calculate the synthesis frequency by $1/f_{TAF}=T_{TAF}=F*\Delta$, i.e., $f_{TAF}=1/(F*\Delta)$. Given enough resource (i.e., giving sufficient number of bits to I and r in the frequency control word F), then the TAF-DPS frequency synthesizer 110 can generate any frequency (arbitrary frequency generation). Further, since each individual pulse is directly generated according to the input basic time unit $\Delta$ and the frequency control word F, the output frequency/period can be instantly changed, that is, fast frequency switching can be realized.

Figure 2:
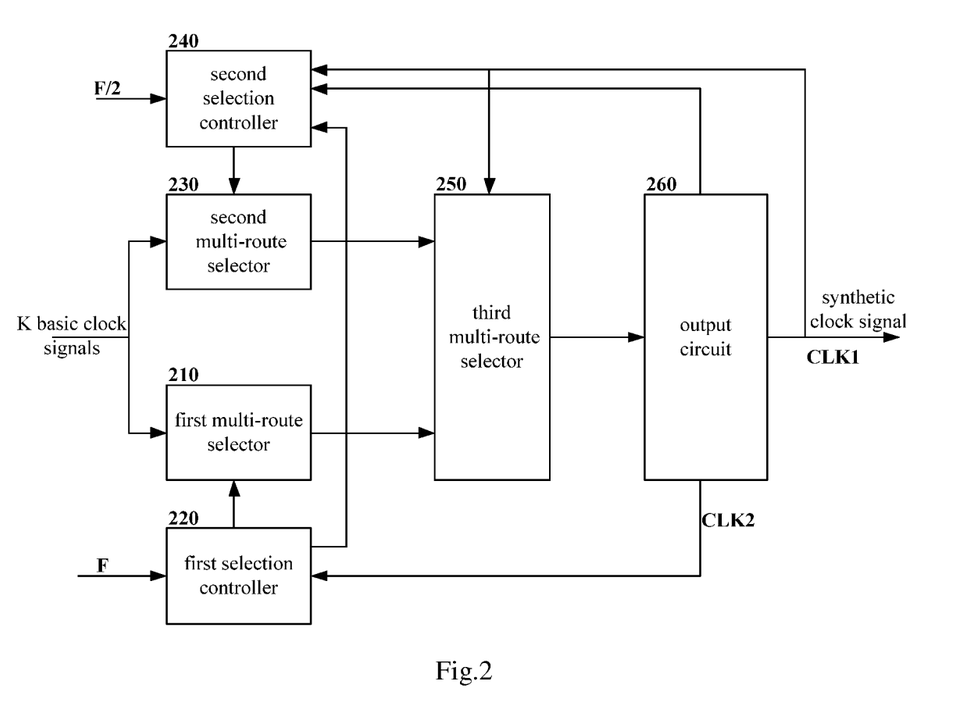
FIG. 2 is an exemplary circuit block diagram of the TAF-DPS frequency synthesizer as shown in FIG. 1.

FIG. 2 is an exemplary circuit block diagram of the TAF-DPS frequency synthesizer as shown in FIG. 1. A flying-adder frequency synthesis architecture as shown in FIG. 2 can be utilized as all-digital circuit implementation of the TAF-DPS frequency synthesizer as shown in FIG. 1.

As shown in FIG. 2, the TAF-DPS frequency synthesizer comprises a first multi-route selector 210, a first selection controller 220, a second multi-route selector 230, a second selection controller 240, a third multi-route selector 250, and an output circuit 260.

The first selection controller 220 produces a first selection control signal according to a first frequency control word, the second selection controller 240 produces a second selection control signal according to a second frequency control word, and the first frequency control word and the second frequency control word are determined according to the frequency control word F. Optionally, the first frequency control word is equal to the frequency control word F, and the second frequency control word is a half of the frequency control word F.

The first selection controller 220 outputs the first selection control signal to the first multi-route selector 210, and the second selection controller 240 outputs the second selection control signal to the second multi-route selector 230.

The first multi-route selector 210 receives a plurality of basic clock signals, and selects one of the plurality of basic clock signals as a first selection clock signal according to the first selection control signal; the second multi-route selector 230 receives the plurality of basic clock signals, and selects one of the plurality of basic clock signals as a second selection clock signal according to the second selection control signal.

Next, the third multi-route selector 250 selects one of the first selection clock signal and the second selection clock signal as a selection clock signal.

Finally, the output circuit 260 generates a synthetic clock signal CLK1 and an intermediate clock signal CLK2 based on the selection clock signal, and phases of the synthetic clock signal CLK1 and the intermediate clock signal CLK2 have a difference of 180°. As an example, the plurality of basic clock signals can be K basic clock signals, K is an integer greater than 1, a frequency of each basic clock signal of the K basic clock signals is $f_{div}$ and a period of the same is $T_{div}$, and the K basic clock signals lags $T_{div}/K$ in time and lags 360°/K in phase sequentially. A time difference between two adjacent basic clock signals is the basic time unit $\Delta=T_{div}/K=1/(K·f_{div})$.

According to the embodiment of the present disclosure, the TAF-DPS frequency synthesizer controls the frequency of the synthetic clock signal output by itself according to the first frequency control word and the second frequency control word.

Figure 3:
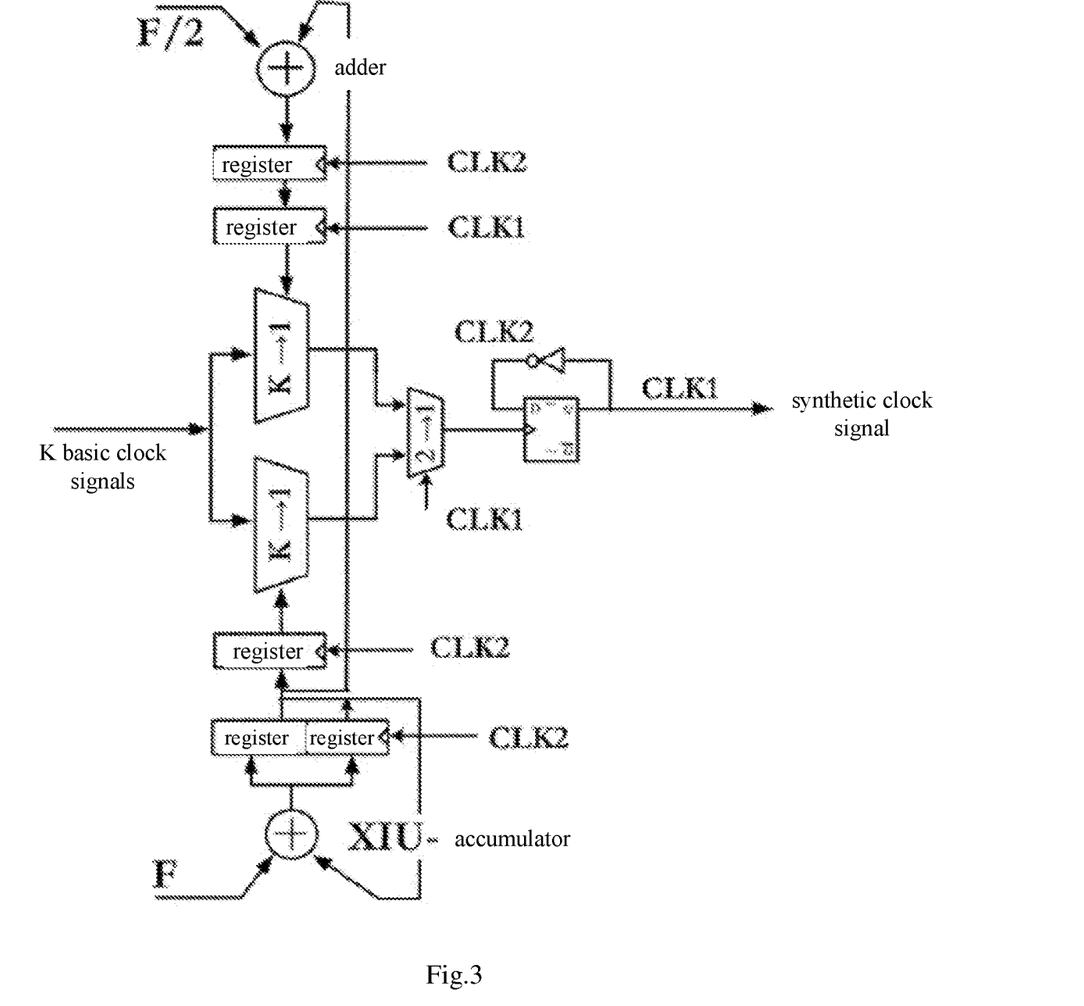
FIG. 3 is an exemplary circuit diagram of the exemplary circuit block diagram of the TAF-DPS frequency synthesizer as shown in FIG. 2.

FIG. 3 is an exemplary circuit diagram of the exemplary circuit block diagram of the TAF-DPS frequency synthesizer as shown in FIG. 2.

The first selection controller 220 has a first input terminal and a second input terminal, the first input terminal receives a first frequency control word, and the value of the first frequency control word equates to the value of the frequency control word F; the second input terminal receives an intermediate clock signal CLK2. The first selection controller 220 generates the first selection control signal according to the first frequency control word F and the intermediate clock signal CLK2, and generates a control word adjusting signal according to the first frequency control word F and the intermediate clock signal CLK2. The first selection controller 220 has a first output terminal and a second output terminal, the first output terminal outputs the first selection control signal, and the second output terminal outputs the control word adjusting signal.

The second selection controller 240 has a first input terminal, a second input terminal, a third input terminal and a fourth input terminal, the first input terminal receives a second frequency control word, the value F/2 of the second frequency control word is a half of the value of the frequency control word F, the second input terminal receives the synthetic clock signal CLK1, the third input terminal receives the intermediate clock signal CLK2, and the fourth input terminal receives the control word adjusting signal. The first selection controller 220 generates the second selection control signal according to the second frequency control word F/2, the synthetic clock signal CLK1, the intermediate clock signal CLK2 and the control word adjusting signal.

The first selection controller 220 comprises a first adder, a first register and a second register. A first input terminal of the first adder is taken as a first input terminal of the first selection controller 220 to receive the first frequency control word, and a second input terminal of the first adder receives the control word adjusting signal. A first input terminal of the first register is connected to an output terminal of the first adder, a second input terminal of the first register receives the intermediate clock signal CLK2, an output terminal of the first register is taken as a second output terminal of the first selection controller 220 and outputs the control word adjusting signal; a first input terminal of the second register is connected to the output terminal of the first register, a second input terminal of the second register receives the intermediate clock signal CLK2, and an output terminal of the second register is taken as a first output terminal of the first selection controller 220 and outputs the first selection control signal.

The second selection controller 240 comprises a second adder, a third register and a fourth register. Two input terminals of the second adder are taken as a first input terminal and a fourth input terminal of the second selection controller 240 to receive the second frequency control word and the control word adjusting signal. A first input terminal of the third register is connected to an output terminal of the second adder, a second input terminal of the third register receives the intermediate clock signal CLK2, a first input terminal of the fourth register is connected to an output terminal of the third register, a second input terminal of the fourth register receives the synthetic clock signal CLK1, and an output terminal of the fourth register is taken as the output terminal of the second selection controller 240 and outputs the second selection control signal.

As shown in FIG. 3, the TAF-DPS frequency synthesizer controls the frequency of the synthetic clock signal output by itself according to the first frequency control word F and the second frequency control word F/2, that is, the frequency $f_{TAF}$ of the synthetic clock signal output by the TAF-DPS frequency synthesizer satisfies: $1/f_{TAF}=T_{TAF}=F*\Delta$. As described above, the frequency control word F=I+r, where I is an integer, r is a fractional number, and 0≤r<1. When only integers are used in the control word F (i.e., r=0), the TFA-DPS frequency synthesizer outputs a signal with a single frequency. When the control word F comprises a part for a fractional number (0<r<1), the TAF-DPS frequency synthesizer uses a time average frequency concept in its output pulse signal. The TAF-DPS frequency synthesizer can be used as the circuit block 110 in FIG. 1. The signal F is used as the frequency control word F in FIG. 1. The output synthetic clock signal is used as the synthetic clock signal in FIG. 1.

Figure 4:
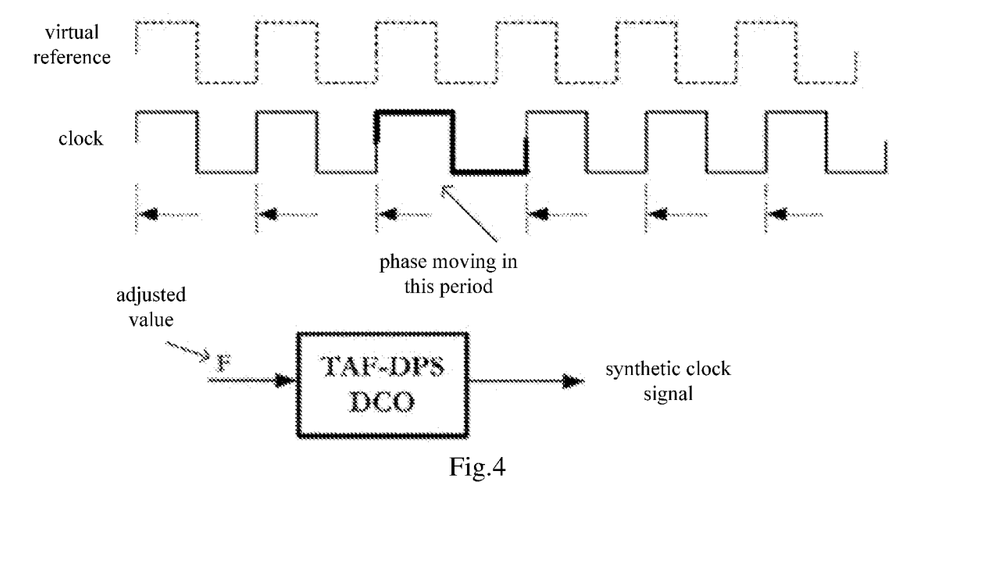
FIG. 4 shows a phase adjusting mechanism of a TAF-DPS clock generator.

FIG. 4 shows a schematic diagram of principle of a phase synthesis of a TAF-DPS clock generator.

Capability of direct period synthesis of the TAF-DPS clock generator as shown in FIG. 1 not only can be used to synthesize frequency/period but also can be used for adjusting its output synthetic clock signal's phase. This phase adjusting mechanism is illustrated in FIG. 4. The period of the corresponding pulse is adjusted by a one-shot change of the given frequency control word F, in particular lengthening or shortening the period of the corresponding pulse. This would result in advancing or lagging of the phase of the synthetic clock signal.

As shown in FIG. 4, an adjustment value is added to the frequency control word F, so that the output pulse string would have a lengthened or shortened period. This function would be used for constructing the all-digital PLL in the embodiment of the present disclosure.

According to the embodiment of the present disclosure, the all-digital frequency-locked loop and the phase-locked loop in the integrated circuit (for example, a very large scale VLSI integrated circuit) can be constructed by utilizing the TAF-DPS.

Figure 5:
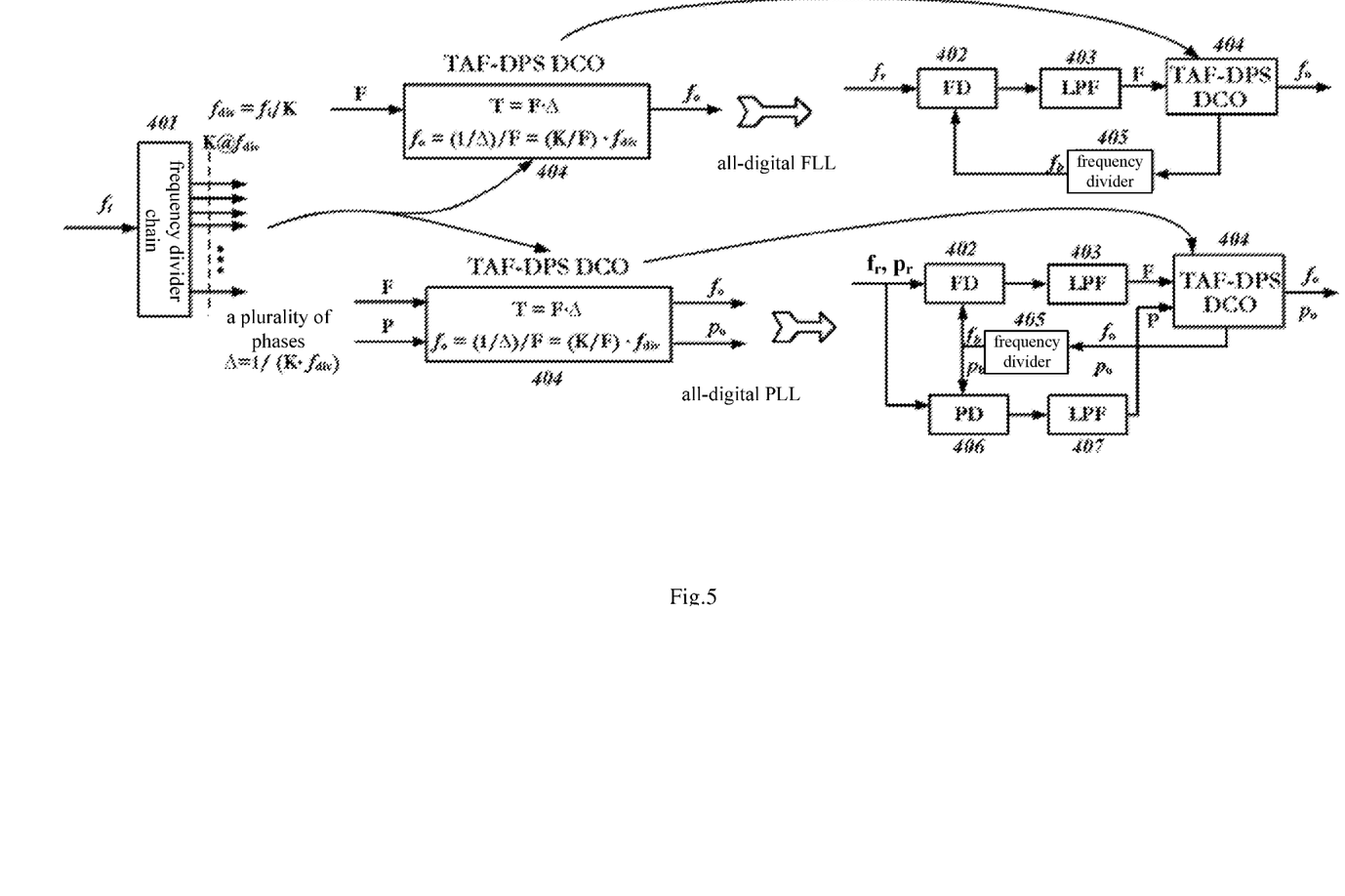
FIG. 5 shows an all-digital frequency-locked loop PLL using the TAF-DPS as its DCO (upper right) and an all-digital phase-locked loop PLL using the TAF-DPS as its DCO (lower right) according to an embodiment of the present disclosure.

FIG. 5 shows an all-digital frequency-locked loop FLL using the TAF-DPS as its DCO (upper right) and an all-digital phase-locked loop PLL using the TAF-DPS as its DCO (lower right) according to an embodiment of the present disclosure.

Operations of the all-digital frequency-locked loop FLL and the all-digital phase-locked loop according to an embodiment of the present disclosure will be described in detail below.

As shown in the upper right figure of FIG. 5, the all-digital frequency-locked loop FLL comprises: a digital frequency detector (FD) 402, a time average frequency direct period synthesis digitally controlled oscillator (TAF-DPS DCO) 404 and a frequency divider 405. Optionally, the all-digital frequency-locked loop FLL can further comprise a low pass filter (LPF) 403. The digital frequency detector (FD) 402, a low pass filter (LPF) 403, the time average frequency direct period synthesis digitally controlled oscillator (TAF-DPS DCO) 404 and the frequency divider 405 are connected in series sequentially to form a loop.

The TAF-DPS DCO 404 is composed of a frequency divider chain 404 and the TAF-DPS frequency synthesizer as shown in FIG. 2.

An input terminal of the frequency divider chain 401 receives an input clock signal, and the frequency of the input clock signal is L. The frequency divider chain 401 is configured to perform frequency division on the input clock signal to produce K basic clock signals, and feed the K basic clock signals to the TAF-DPS frequency synthesizer, wherein K is an integer greater than 1, the frequency of each basic clock signal of the K basic clock signals is $f_{div}$ and the period of the same is $T_{div}$, and the K basic clock signals lag $T_{div}/K$ in time and lag 360/K in phase successively. A time difference between two adjacent basic clock signals is the basic time unit $\Delta=T_{div}/K=1/(K\cdot f_{div})$.

An input terminal of the TAF-DPS frequency synthesizer receives the frequency control word F output by the low-pass filter (LPF) 403, and the TAF-DPS frequency synthesizer produces a synthetic clock signal according to the received frequency control word F and the K basic clock signals, and the frequency of the synthetic clock signal is $f_o$. An output terminal of the TAF-DPS frequency synthesizer is taken as the output terminal of the all-digital frequency-locked loop FLL, and outputs the synthetic clock signal.

The frequency divider 405 receives the synthetic clock signal through its input terminal, and performs frequency division on the synthetic clock signal to produce a feedback clock signal. An output terminal of the frequency divider 405 outputs the feedback clock signal, and a feedback clock frequency of the feedback clock signal is $f_b=f_o/N$, where N is a frequency dividing ratio of the frequency divider 405, and N is an integer greater than 1.

A first input terminal of the digital frequency detector 402 is taken as the input terminal of the all-digital frequency-locked loop FLL, and receives an input reference frequency $f_r$. A second input terminal of the digital frequency detector 402 receives the feedback clock signal output from the frequency divider 405, and the frequency of the feedback clock signal is $f_b$. The digital frequency detector 402 is configured to detect the feedback clock frequency $f_b$ of the feedback clock signal, and produce or update the frequency control word F based on the input reference frequency $f_r$ and the feedback clock frequency $f_b$. For example, the digital frequency detector 402 can be configured to compare the input reference frequency $f_r$ with the feedback clock frequency $f_b$, to obtain a first control signal related to a frequency difference and generate the first control word F according to the first control signal. Herein, both the first control signal and the first control word are digital values.

Optionally, the low-pass filter 403 is configured to filter high frequency components and noises in the first control word output by the digital frequency detector 402, and output the filtered first control word as the frequency control word to the TAF-DPS DCO 404. In the case without low-pass filter 403, the digital frequency detector 402 can directly output the first control word as the frequency control word to the TAF-DPS DCO 404. Then, the TAF-DPS DCO 404 produces the synthetic clock signal based on the frequency control word F. Thus, a closed loop operation of the all-digital frequency-locked loop FLL is formed.

According to the embodiment of the present disclosure, in the all-digital frequency-locked loop FLL, the input reference frequency is compared with the frequency of the synthetic clock signal generated by the TAF-DPS DCO 404, and the frequency control word F to be input to the TAF-DPS DCO 404 is gradually adjusted according to a comparison result, until the frequency of the generated synthetic clock signal is consistent with the input reference frequency, so as to realize the frequency locking function of the all-digital frequency-locked loop FLL.

In the lower right figure of FIG. 5, components the same as the upper right figure of FIG. 5 have adopted same reference marks.

As shown in the lower right figure of FIG. 5, the all-digital frequency-locked loop PLL comprises: a digital frequency detector (FD) 402, a time average frequency direct period synthesis digitally controlled oscillator (TAF-DPS DCO) 404, a frequency divider 405 and a digital phase detector (PD) 406. Optionally, the all-digital phase-locked loop PLL can further comprise low-pass filters (LPF) 403 and 407. The digital frequency detector (FD) 402, the low-pass filter (LPF) 403, the TAF-DPS DCO 404 and the frequency divider 405 are connected in series sequentially. The frequency detector 406, the low-pass filter 407, the TAF-DPS DCO 404 and the frequency divider 405 are connected in series sequentially.

Functions and principles of components the same as the upper right figure of FIG. 5 are the same as those of the upper right figure of FIG. 5, and thus no further details are given herein.

A first input terminal of the TAF-DPS frequency synthesizer receives the frequency control word F, a second input terminal of the TAF-DPS frequency synthesizer receives a phase control word P, and a synthetic clock signal is produced according to the frequency control word F, the phase control word P and the K basic clock signals, and a frequency of the synthetic clock signal is $f_o$ and a phase thereof is $p_o$. An output terminal of the TAF-DPS frequency synthesizer is taken as an output terminal of the all-digital phase-locked loop PLL, and outputs the synthetic clock signal.

An input terminal of the frequency divider 405 receives the synthetic clock signal, a frequency of the synthetic clock signal is $f_o$ and a phase thereof is $p_o$. Frequency division is performed on the synthetic clock signal to produce a feedback clock signal. An output terminal of the frequency divider 405 outputs the feedback clock signal, a feedback clock frequency of the feedback clock signal is $f_b=f_o/N$, and a feedback clock phase of the feedback clock signal is $p_b=p_o/N$, where N is a frequency dividing ratio of the frequency divider 405, and N is an integer greater than 1.

A first input terminal of the digital phase detector (PD) 406 is taken as the input terminal of the all-digital phase-locked loop PLL, and receives an input reference phase $p_r$. A second input terminal of the digital frequency detector 402 receives the feedback clock signal output from the frequency divider 405, and a feedback clock phase of the feedback clock signal is $p_b$. The digital phase detector (PD) 406 is configured to detect the feedback clock phase $p_b$ of the feedback clock signal, and produce or update a second control word P based on the input reference phase $p_r$ and the feedback clock phase $p_b$. For example, the digital phase detector (PD) 406 can be configured to compare the input reference phase $p_r$ with the feedback clock phase $p_b$, to obtain a second control signal related to a phase difference and generate a second control word P according to the second control signal. Herein, both the second control signal and the second control word are digital values.

Optionally, the low-pass filter 407 is configured to filter high frequency components and noises in the second control word outputted by the digital phase detector 406, and output the filtered second control word as the phase control word P to the TAF-DPS DCO 404. In the case without low-pass filter 407, the digital phase detector 406 can directly output the second control word as the phase control word to the TAF-DPS DCO 404. Then, the TAF-DPS DCO 404 produces the synthetic clock signal based on the frequency control word F and the phase control word P. Thus, a closed loop operation of the all-digital phase-locked loop PLL is formed.

According to an embodiment of the present disclosure, as described above, the phase control word P and the frequency control word F may be added to obtain a new frequency control word F, so as to adjust a period of a corresponding output pulse by a one-shot adjustment of the frequency control word F, so that the period of the corresponding pulse is lengthened or shortened, thereby achieving the effect of adjusting the phase of the output signal.

According to an embodiment of the present disclosure, in the all-digital phase-locked loop PLL, not only the input reference frequency may be compared with the frequency of the synthetic clock signal generated by the TAF-DPS DCO 404, but also the input reference phase may be compared with the phase of the synthetic clock signal generated by the TAF-DPS DCO 404. Moreover, the frequency control word F and the phase control word P to be input to the TAF-DPS DCO 404 are gradually adjusted according to comparison results, until both the frequency and the phase of the generated synthetic clock signal are consistent with the input reference frequency and the input reference phase respectively, so as to realize the phase locking function of the all-digital frequency-locked loop FLL.

Unless otherwise defined, all the terms (including technical and scientific terms) used herein have the same meaning commonly understood by those ordinary skilled in the art of the present disclosure. It shall be further understood that those terms defined in a general dictionary shall be interpreted as having meanings consistent with the meanings in the text of related art, but shall not be explained using ideal or extreme formal meanings unless explicitly defined herein.

The above are descriptions of the present disclosure, but shall not be deemed as limitations thereto. Although several exemplary embodiments of the present disclosure are described, it would be easy for those skilled in the art to understand that various amendments can be made to exemplary embodiments without departing from novel teachings and advantages of the present disclosure. Therefore, all these amendments intend to be included within the scope of the present disclosure defined in the Claims. It shall be understood that the above are descriptions of the present disclosure, but shall not be deemed to be limited to the specific embodiments of the present disclosure, and any amendment made to the embodiments of the present disclosure and other embodiments intends to be included within the scope of the Claims attached thereto. The present disclosure is defined by the Claims and equivalents thereof.

What is claimed is:

1. An all-digital phase-locked loop, comprising:
  a digitally controlled oscillator, which comprises:
    a frequency divider chain, configured to perform frequency division on an input clock signal to produce K basic clock signals, wherein frequencies and periods of the K basic clock signals are the same, and a time difference between two adjacent basic clock signals is a basic time unit; and
    a frequency synthesizer, configured to receive the K basic clock signals from the frequency divider chain, determine a first period and a second period according to the basic time unit, a frequency control word and a phase control word, and generate a synthetic clock signal based on the K basic clock signals, wherein the synthetic clock signal uses the first period and the second period in an alternate manner;
  a frequency divider, configured to receive a frequency of the synthetic clock signal and a phase of the synthetic clock signal and configured to perform frequency division on the synthetic clock signal output by the digitally controlled oscillator, to obtain a feedback clock signal, wherein a frequency dividing ratio is N, and N is an integer greater than or equal to 1; and
  a digital frequency detector, configured to detect a feedback clock frequency of the feedback clock signal, compare an input reference frequency with the feedback clock frequency, and update the frequency control word according to a frequency difference; and a digital phase detector, configured to detect a feedback clock phase of the feedback clock signal, compare an input reference phase with the feedback clock phase, and generate the phase control word according to a phase difference, wherein the digital frequency detector and the digital phase detector are connected to the frequency divider to receive the feedback clock frequency of the feedback clock signal and the feedback clock phase of the feedback clock signal respectively, the digitally controlled oscillator further receives the phase control word, and adds the phase control word and the updated frequency control word to be an updated frequency control word.

2. The all-digital phase-locked loop according to claim 1, further comprising:

a first low-pass filter, configured to filter high frequency components and noises in an output signal of the digital frequency detector, and output a filtered signal as an updated frequency control word to the digitally controlled oscillator.

3. The all-digital phase-locked loop according to claim 1, further comprising:

a second low-pass filter, configured to filter high frequency components and noises in an output signal of the digital phase detector, and output a filtered signal as a phase control word to the digitally controlled oscillator.

4. The all-digital phase-locked loop according to claim 1, wherein devices of the all-digital phase-locked loop are digital devices.

5. The all-digital phase-locked loop according to claim 1, wherein a frequency and a period of the synthetic clock signal are calculated by the following formula:

$$1/f = T = F * \Delta,$$

where F is the frequency control word, $\Delta$ is the basic time unit, f is the frequency of the synthetic clock signal, and T is the period of the synthetic clock signal.

6. The all-digital phase-locked loop according to claim 5, wherein the frequency control word equates to I+r, where I is an integer, $0 \leq r < 1$, where the first period equates to $I*\Delta$, the second period equates to $(I+1)*\Delta$, r is possibility of occurrence of the second period, and the period of the synthetic clock signal equates to $(1-r)*$ the first period+r*the second period.

7. The all-digital phase-locked loop according to claim 1, wherein a value of the basic time unit $\Delta = T_{div}/K = 1/(K \cdot f_{div})$, $f_{div} = f_i/K$, wherein $T_{div}$ is the period of the K basic clock signals, $f_{div}$ is the frequency of the K basic clock signals, and $f_i$ is a frequency of the input clock signal of the frequency divider chain.

8. The all-digital phase-locked loop according to claim 1, wherein the frequency synthesizer is a TAF-DPS frequency synthesizer.

* * * * *